(12) United States Patent
Sandstrom

(10) Patent No.: US 6,813,058 B1
(45) Date of Patent: Nov. 2, 2004

(54) METHOD AND APPARATUS FOR PERSONALIZATION OF SEMICONDUCTOR

(75) Inventor: Torbjorn Sandstrom, Pixbo (SE)

(73) Assignee: Micronic Laser Systems AB, Taby (SE)

( * ) Notice: Subject to any disclaimer, the term of this patent is extended or adjusted under 35 U.S.C. 154(b) by 0 days.

(21) Appl. No.: 10/129,364

(22) PCT Filed: Nov. 24, 2000

(86) PCT No.: PCT/SE00/02325

§ 371 (c)(1),
(2), (4) Date: May 3, 2002

(87) PCT Pub. No.: WO01/39269

PCT Pub. Date: May 31, 2001

(30) Foreign Application Priority Data

Nov. 24, 1999 (SE) .............................................. 9904277

(51) Int. Cl.$^7$ ............................................. G02B 26/00
(52) U.S. Cl. ................................................... 359/290
(58) Field of Search ....................... 359/2, 290; 347/239

(56) References Cited

U.S. PATENT DOCUMENTS

| 4,409,686 A | 10/1983 | Ports et al. |
| 5,294,812 A | 3/1994 | Hashimoto et al. |
| 5,495,279 A | 2/1996 | Sandstrom |
| 5,959,763 A | * 9/1999 | Bozler et al. ............... 359/290 |
| 6,222,650 B1 | * 4/2001 | Long .............................. 359/2 |
| 6,414,706 B1 | * 7/2002 | Allen et al. ................. 347/239 |

FOREIGN PATENT DOCUMENTS

| DE | 198 29 674 A1 | 1/2000 |
| EP | 0 434 141 A1 | 6/1991 |

* cited by examiner

Primary Examiner—John F. Niebling
Assistant Examiner—Andre' C. Stevenson
(74) Attorney, Agent, or Firm—Harness Dickey

(57) ABSTRACT

A system for making small modifications to the pattern in standard processed semiconductor devices. The modifications are made to create a small variable part of the pattern against a large constant part of the same pattern. In a preferred embodiment the exposure of the variable and constant parts are done with the same wavelength in the same combined stepper and code-write. The invention devices a way of writing variable parts of the chip that is automatic, inexpensive and risk-free. A system for automatic design and production of die-unique patterns is also shown.

7 Claims, 5 Drawing Sheets

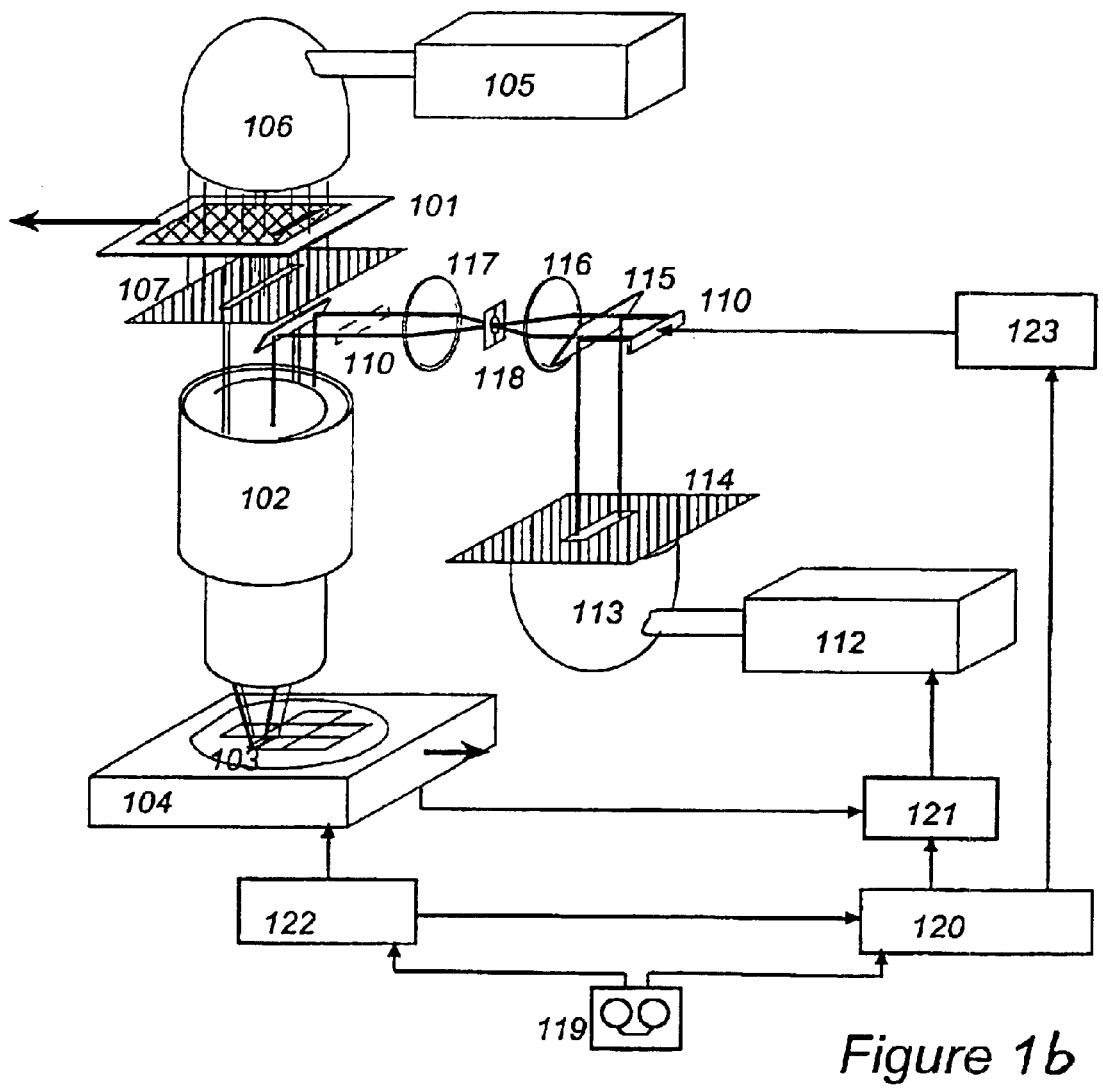
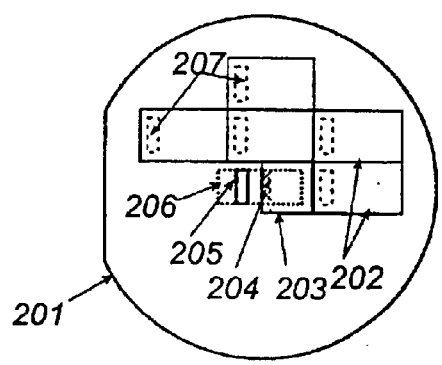
Figure 1b
Figure 2

METHOD AND APPARATUS FOR PERSONALIZATION OF SEMICONDUCTOR

This application is the national phase under 35 U.S.C. §371 of PCT International Application No. PCT/SE00/02325 which has an International filing date of Nov. 24, 2000, which designated the United States of America.

FIELD OF THE INVENTION

The present invention relates to the production of semiconductor chips and other devices by photolithography. In particular it relates to creating devices with unique codings or other unique visual, optical or electronic properties. In a different sense the invention relates to the device itself and the design process of the device. Yet other aspects of the invention are the creation of tamper-proof implements that carry an electronic signature or cryptographic key. The invention also relates to reliability tracking of electronic devices and systems. Finally, an important aspect of the invention is related to reconfiguring devices containing several design versions or redundance functional units, such as for parametric experiments on an analog chip.

BACKGROUND OF THE INVENTION

Modern production of semiconductor chips and also of surface acoustic devices, thin-film magnetic heads and similar devices is done by steppers. Modern steppers use four times reduction, excimer lasers as illumination source and use a step-and-scan principle where the wafer and reticle are scanned during exposure. In this context any type of stepper will be referred to as a stepper or as a scanning stepper where the distinction is important.

The important property of a stepper is that it produces identical copies of the same die by exposing the same mask at each exposure site. By doing so in an efficient way it provides high through-put and production economy. There are situation and cases where the chips should not be identical, such as for parameter try-out in research and development (R&D). The manufacturer is then forced to complicated procedures, like writing part of the pattern in an e-beam pattern generator or performing focussed ion-beam modification of the devices.

In other cases there is a need to provide a unique signature or code or programming to each chip. A common way to include such codes is by using electronically programmable circuits, often by changing reversibly or irreversibly the potential of a floating gate electrode, or by programmable fused links or so called anti-fuse links. In either case there are extra process steps, extra manufacturing cost and/or extra driving involved.

SUMMARY OF THE INVENTION

It is therefore an object of the present invention to provide a method and an apparatus to alleviate said shortcomings in the prior art.

This object is achieved with the invention according to the appended claims.

The invention devices a method to do such unique programming in a standard process with very little extra cost incurred. The invention allows virtually every ship to have a visually or electronically readable unique code. The code can be used as a serial number for a processor, for self configuration in networked devices or for tracking of faults and errors back to the lot, wafer and chip during manufacturing, thereby providing data for quality improvement.

Another aspect of the invention is that it provides a design block that can be included in any standard design to provide a visually or electronically readable code or a chip-unique programming. The block can provide a combination of a layout block and a computer program or compilation of data that together provides the desired programming at the time of exposure. The invention devices a method by which the code generation can be specified at design time and executed in an automated fashion.

The words coding, programming and personalization are used interchangeably throughout the application to denote the creation of a function that is different between different dies or chips. The apparatus or attachment that writes the code or programming is called a code-writer.

BRIEF DESCRIPTION OF THE DRAWINGS

For exemplifying purposes, the invention will be described in closer detail in the following with reference to embodiments thereof illustrated in the attached drawings.

FIG. 2 shows a magnified view of the wafer in FIG. 1.

DETAILED DESCRIPTION OF THE INVENTION

Figure 1A:
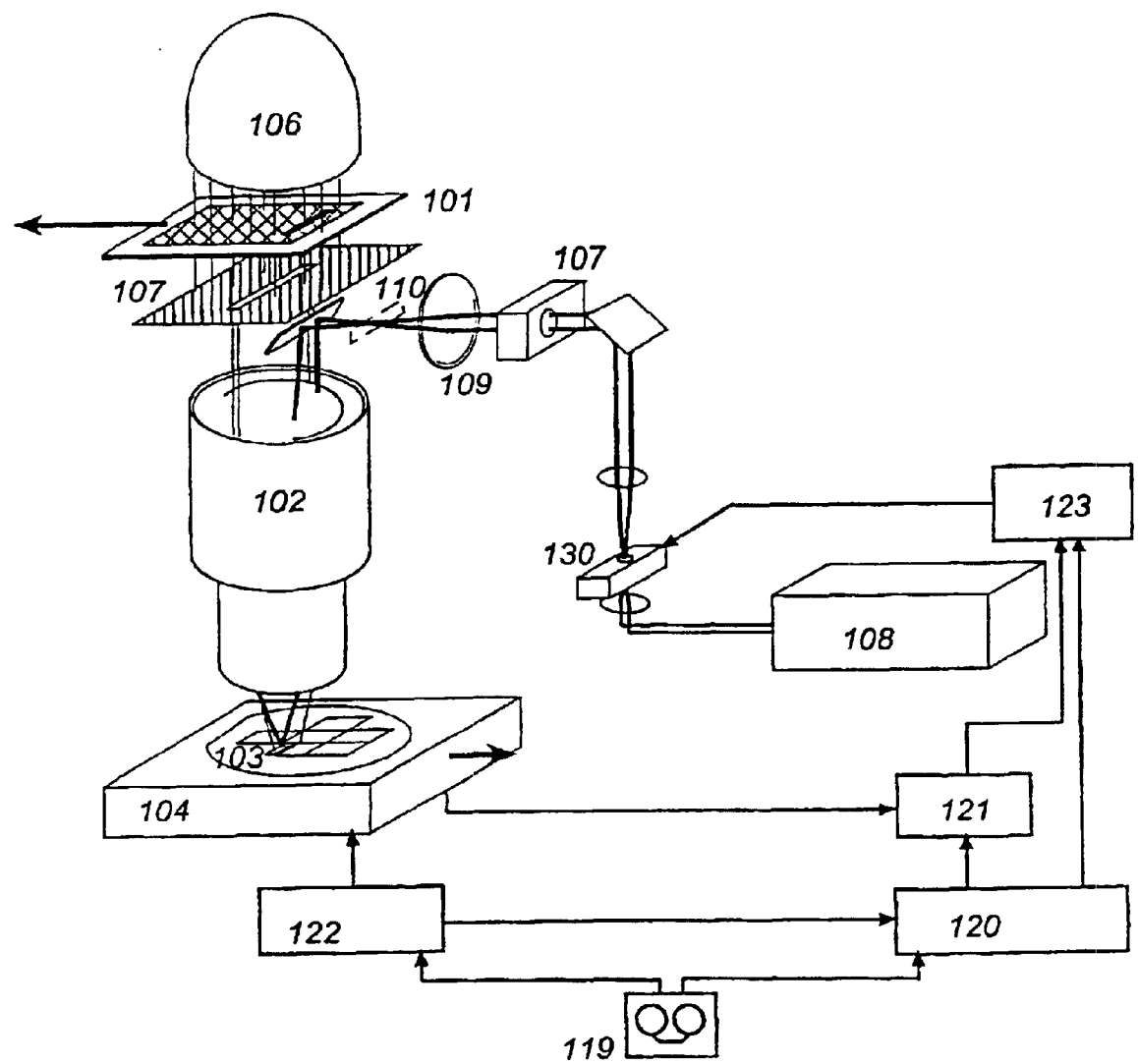
FIG. 1 shows preferred embodiments of the code writer in the form of a step-and-scan-system and a code-writing attachment using a laser scanner (1a) and an Spatial Light Modulator (SLM) (1b).

The invention provides elements of creating unique electronic devices, in particular semiconductor chips. The uniqueness can consist of an ID code, a visual marking, an embedded cryptographic key, or any other unique characteristic of the chip. Other uses could be for creating a uniquely coded surface acoustic filter or optical security devices, similar to the holographic area on a credit card. An important application is for R&D work where several versions of a block can be tested, e.g. four designs of an analog. amplifier, either by including several designs in the same chip and connecting them only one of them in each chip, or alternatively have the code-writer to write the components differently, e.g. transistors with different width in different chips. Many other uses are possible, some of them new or unforeseen since the invention makes the cost of adding personalizes features to a standard chip very low. An example of a such new use would be a lottery with electronic lots or tokens.

The principle of the invention is that an area of the chip is set aside for programming in the normal reticle set. This area is programmed by a special code-writing system. Another way to express this it to call it a constant and a variable part of the pattern where the constant part comes from the reticle and the variable part from the code-writer. Note that the constant part of the chip extends through all layers while the variable part is normally confined to a single layer.

The coding exposure is made in the same photoresist layer, preferably using the same wavelength, or the exposure wavelengths are close together such as with exposure wavelength 248 nm and coding at 266, exposure at i-line and coding at 364 nm, etc. Preferably the exposure and coding are done with exactly the same wavelength, something that can often be accomplished in the SLM embodiment which can use both discharge lamps and excimer lasers as light sources. Therefore the process will not see the difference between the variable and constant part, and most of the process complexity associated with direct-writing e-beam schemes are absent. None of the hurdles normally associated with direct-writing are present: long writing times are absent since the constant part of the layer is exposed from a normal mask, extensive process development is absent since the process is identical to the standard process, The critical alignment step is absent, but it is already done by the stepper if the code-writer is integrated. in the stepper. Bringing the wafer out from the standard process flow, writing in an electron beam system, and reinserting it does not happen either, if the code-writer is integrated into the stepper. Therefore the personalization by the invention is easy, inexpensive and risk-free.

Most preferably the programming is done during the exposure in a stepper by an integrated code-writing unit in the stepper. The code-writing hardware consists of a laser scanner or a spatial light modulator, (SLM) 110 and a light-source 112, preferably producing the same wavelength or a wavelength close to that used for exposure of the reticle pattern 101 in the stepper. The image produced by the laser scanner or SLM is projected to the mask plane or an equivalent optical plane 119 so that it can be projected by the main projection lens 102 onto the wafer 103.

In an embodiment where the code-writer is not integrated with a stepper it has to provide the same functionality as a stepper except for the projection of a reticle: a servo-controlled accurate stage, an alignment system (or else the function is limited to the first layer on the wafer), a projection system for projecting the image of the code (in which case there is no need to form an intermediate image, but the image can be projected directly onto the wafer) and a computerized control system for controlling the hardware and the writing procedure. Typically it would also include a automatic loading station for wafers and an enclosure with a controlled environment.

Figure 4:
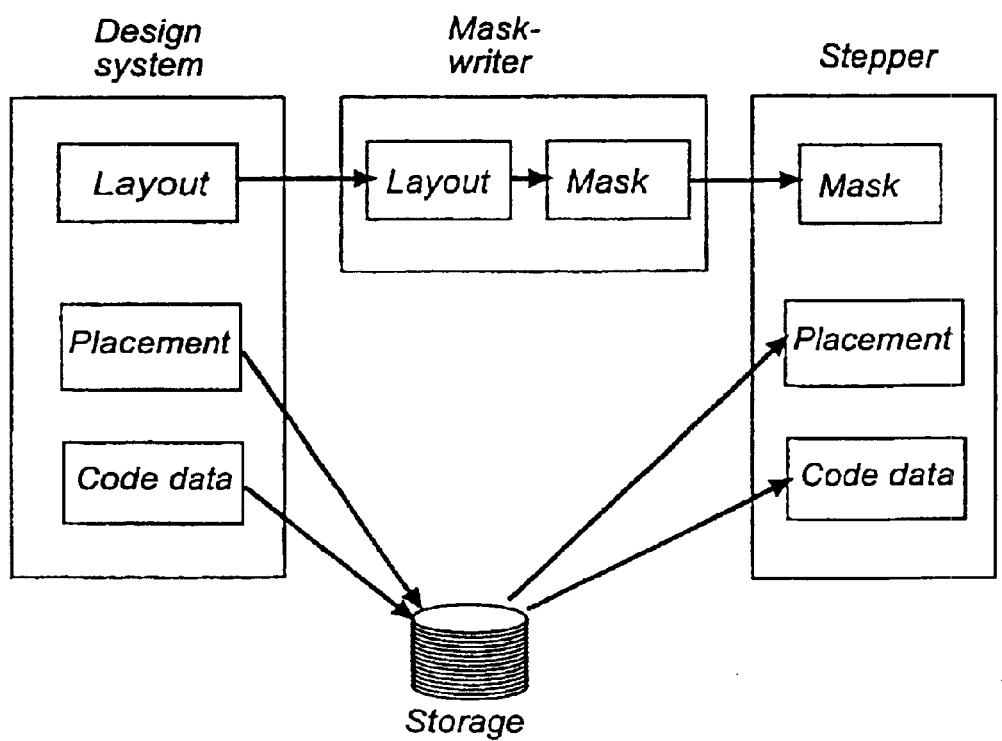
FIG. 4 shows the design information flow.

The programmable section of the chip is typically a design block which provides a layout area for programming, and in the case of an electrically readable code also logic for reading and communicating the code. A more complicated block contains Processing resources for using the code e.g. for encryption. The library block used in the design software also has a tag or an association that generates instructions for the control software to request the coding information from a coding information unit at the time of writing the coding information. The block could be made into a standard block and distributed as a reusable module, a so-called IP block. To do so the entire design chain is slightly modified, FIG. 4. The library block or IP block has a tag to the information needed for the stepper control system to place the programmable part and the data (table data or an instruction sequence) to create the code The association is similar to an association between a layout block and its Spice model in a typical design system. The associated information has no use in the mask-writing step, since the mask block is fully defined by the geometrical layout block. But it has to be conveyed to the stepper together with the finished mask. Preferably the mask has a machine-readable code, e.g. a bar-code, which points to information that the mask has a programmable part and a tag to the data file that contains the necessary information. In this way the system can be made safe against broken data association and other errors.

The stepper control program has to allow for the new type of patterns, so that for each exposed chip the exposure of the code block is initiated, the correct code is built and converted to bitmap or other hardware format, and the servo and control systems cause the pattern to be printed at the right position. In a simple case there is a list of values, one per chip, but in a more complicated embodiment a separate code generation unit need to be called and a code is generated and fed to the writing hardware, possibly using external information such as chip position on the wafer, date and time, stepper identification, random numbers, etc.

The built code can have one of several formats: visually readable, barcode, 2-D "dotcode", electronically readable, etc. and it can be a combination of the types above in expressed in various bases, using error correcting codes, compression, etc. To specify the mark type a sequence of instructions is used with predefined keywords and parameters. For more complex codes a short computer program is included, in a preferred embodiment written in Java or ANSI C, and with predefined library functions or classes to streamline the design. The generality of these programming languages gives the designer free hands to generate a wide variety of codes. The predefined keywords are designed to avoid the complexity of writing programs to define standard types of codes.

The Writer

FIGS. 1*a* and 1*b* and the magnified wafer in FIG. 2 show embodiments of the invention in the form of an integrated code-writer and scanning stepper. The stepper has a stage 104 that scans the wafer 103, 201 under the lens 102 in synchronicity with the scanning of the reticle101 in the reticle plane. The exposure of the fields 207 is controlled by the stepper control system 108 based on an input file 109 of commands.

Figure 5A:
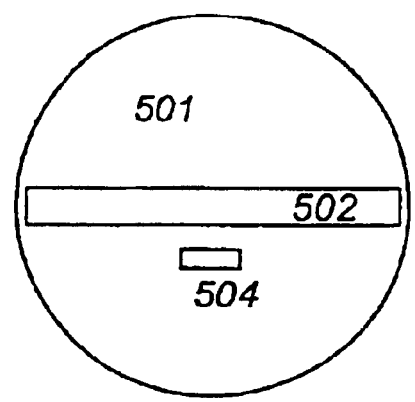
FIG. 5 shows possible placements of the code-writer's window in a scanning stepper (5a) and a stepping stepper (5b). 5c shows a possible placement with a beam-combiner in the system.
Figure 5B:
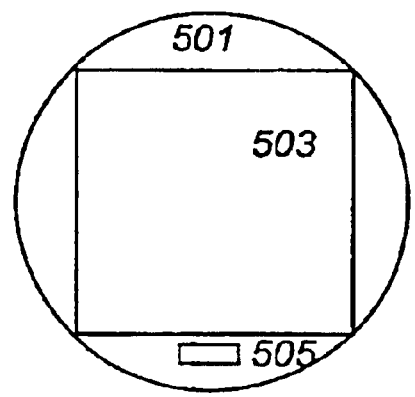

The lens 102 has a slit-like field stop 107 and there is much area outside the field stop where the lens has good imaging properties and where the code-writer's window can be placed, FIG. 5. A mirror ill between the main projection lens 102 and the reticle links an image 119 of the laser scan line or SLM 110, 205 into the optical train, so that it falls at the side of the image of the slit 204. The reticle 101 is illuminated through the illuminator optics 106 by the main excimer laser 105 with 248 nm wavelength and emitting pulses at 1000 Hz, each pulse 30 nanoseconds long. The scanner or SLM 110 is illuminated by another smaller laser 112 with a close wavelength, 248 nm, 257 or 266. The code-writer is triggered by the position control unit 121 getting input from the stage position and from the code-writer control unit 120. The code-writer control unit has information on where the code should be placed and its content as specified in the data input 109. The code raster-izing unit 123 converts the code to a pattern that is fed to the modulator or SLM 110 in time for the exposure. The code 205 can be placed anywhere in the area 206 swept by the code-writer window and the placement of the code is determined by the timing. In the embodiment in 1*b* the code-writer uses an excimer laser 112 with a maximum pulse repetition frequency of 1000 Hz and the SLM 110 is reloaded with new contents between each flash. Since the stage 104 is scanning continuously and the laser flashes are only 30 nanoseconds long the motion will be frozen and a series of sharp images of the SLM are printed on the wafer. With proper synchronization between the stage movement, the laser flashes and the loading of data a patterned area is created like in PCT Application No. WO 99/45439 by the same inventor. In principle it would be possible to fill the wafer 103, 201 with code-writer pattern and thus build a direct-writing system. But the intent with the preferred embodiments is not to provide a system that will write a full layer, but to make very small modifications to a pattern that is exposed from a reticle. It is the combination of the image of the reticle and the image of the code-writer that gives the preferred embodiment its unique property to give a modest personalisation with high throughput and almost no effect on production economy.

Figure 5C:
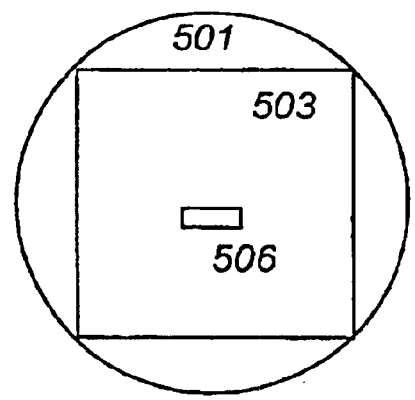
Figure 6:
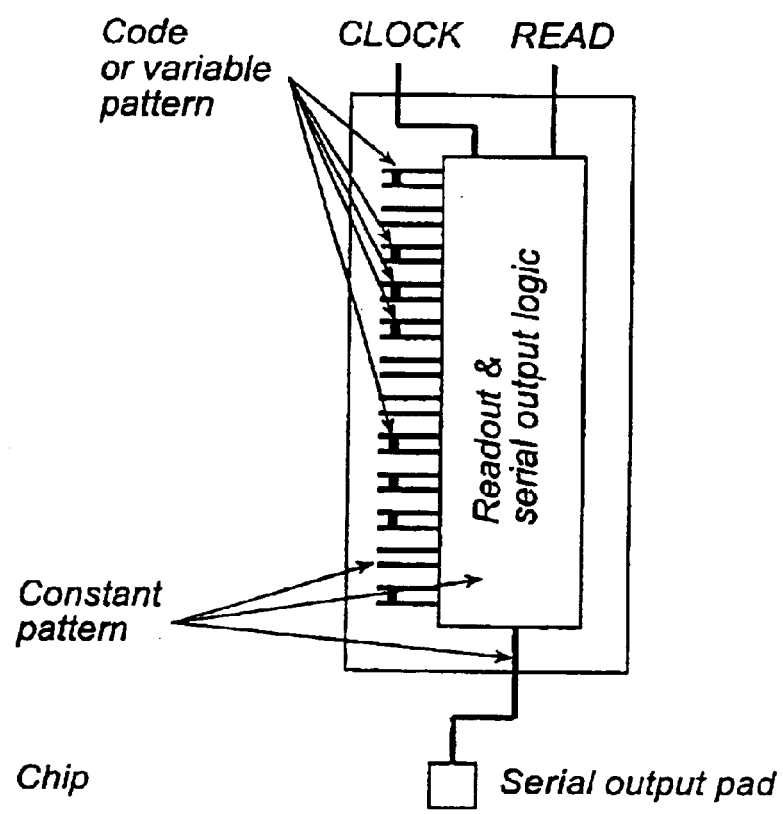
FIG. 6 shows a simple design block for serial out-put of a programmed code.

The stepper to be integrated with the code-writer can be a scanning stepper as in FIG. 1 or an ordinary stepping stepper. Alternatives for placements of the code-writer window in the field of the lens are shown in FIG. 5. The circular field of the projection lens 501 can be used for a square field 503 or a narrow slit 502. In either case there is room outside the field for the image of the SLM 504, 505. In FIG. 5*c* the code-writer image 506 is placed inside the field by means of a semi-transparent mirror or other beamsplitting/combining element.

The combination of a scanning stepper for the exposure from reticle and write-on-the-fly for patterning of the coded area is particularly suitable. Both the main projection system and the code-writer can use essentially the same wavelength, so that both types of patterns have the same process characteristics. This makes the process development and set-up time minimal. It is necessary to focus and align the position of the code-writer window to the stage and to find the right exposure, but thereafter the coded area and areas exposed from the reticle will be identical. There is much freedom as to the placement of the coded block within the chip area without incurring any additional exposure time, since the exposure of the code is done during the scanning to expose the reticle pattern. Thus there is really a possibility of putting a unique programming on each chip at very low expense both in cost, time and development. At the same time the programming scheme is flexible since the code can be placed flexibly and in any layer, or indeed in all layers where it is required.

To make the programming more forgiving for focus and alignment errors it is preferably done with a optical resolution lower than that of the main projection. This is achieved by by sizing the laser beam, FIG. 1*a*, or by using an aperture stop 118 in the projection optics 116, 117 forming the intermediate image 119 of the SLM 110. The SLM can be either deflecting or diffractive as in PCT Application No. WO 99/45439. The analog SLM in Application No. WO 99/45439 allows software controlled dose adjustment, pixel-to-pixel calibration and sizing and placement of the data in a high address grid. Most of the good properties of the invention are maintained with transmissive SLMs and also with schemes with several scanning laser beams.

Control System

A control system is needed which places the codes in the right place and provides the data to the code-writer.

The stepper control system 122 has special provisions to work with the code-writer. When a die is being exposed the control system issues a call to the code-writers control unit 120 to see if there is a code to write. If not, nothing happens and the stepper function is identical to that of a stepper without a code-writer attachment. If on the other hand the code-writer control unit 120 has an instruction to generate a code it computes the code, possibly using the chip number on the wafer, the real-time clock, values from a data table, layout data, a random number generator, etc. depending on the type of code to be written. The code-writer control unit 120 sends the code information to a data-to-raster converter 123, which converts it to bitmap or other hardware format to be fed to the hardware 110, 130, and does at the same time compute the stage position where the information is to be printed and sends it to the position controller 121. When the stage reaches the computed position a data stream (FIG. 1*a*) or a laser flash (FIG. 1*b*) is initiated and the code is exposed onto the wafer. The embodiment with a laser scanner writes a sequence of scan lines while the stage is scanning, thereby filling an area with pattern. The embodiment with SLM prints one or several field. Depending on the exact parameters the SLM prints can be overlapping, abutting each other or separated. In the case of several die in a single field a code can be printed repeatedly in the scanning direction.

Figure 3:
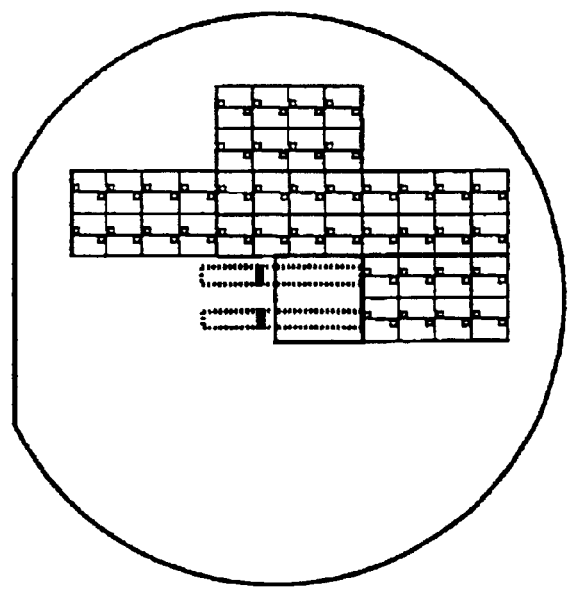
FIG. 3 shows how two code-writing modules can be used to program sixteen identical dies in a single step-per field.

The code-writer window is much smaller than the reticle field. For more than one die in the perpendicular direction is useful to use two code-writing windows. This can be accomplished in several ways, from two complete code-writing modules to a single module with beam-splitting optics. FIG. 3 shows how several dies in each reticle field can be coded by a system having two windows. Highest flexibility but also optomechanical complexity is to have the window movable across the scan direction so that the code-writer can print at any position in the field.

The Coded Device

A design block is used for creating the printing area. For a visually readable mark the print is made in one of the top-most layers of the wafer. Preferably a directory or library block is used which has three parts, the layout information, the instruction for specifying the mark, and the mark data. For a electronically readable mark one has to write electronic devices in other layers and the layout part of the block contains geometries in other layers, typically in all layers.

The Control System

In the case of an independent code-writer, i.e. without the possibility of simultaneous exposure of a mask, the writer must have more or less the same functional blocks as the stepper: a precision controlled stage, a laser light source, a projection lens and an alignment system. In this case the code-writer works from a control file that contains the position on the wafer of the codes and the specification of codes. The stage moves to the desired positions and the code patterns are exposed as in the pattern generators in e.g. the patent EP 0 467 076 by the same inventor. If it is not the first layer and the alignment marks are not formed in the same layer it is necessary to make an alignment of the stage coordinate system to the alignment marks on the wafer. The control system picks the next code to print, moves to that position and sends the code specification to the code pattern generator.

In a preferred embodiment where the code-writer is built as an attachment to a stepper much of the function necessary is already present in the stepper: stage, illumination, alignment, etc. There are several ways to configure a code-writer: The most elegant way is to integrate it into a scanning stepper as in FIG. 1 and write the code during the exposure stroke of the stepper. This allows a unique code to be written with essentially no through-put penalty, and the code can be placed along the line swept by the code-writer window. A second mode is to turn off the main exposure laser and expose only the code during a scanning operation. This gives essentially half the through-put for this particular layer (assuming that a mask exposure also must be done), but gives total flexibility as to where the code is placed. In a stepper without scanning the flexibility is much smaller and in the normal case it seems necessary to make a repositioning of the stage between the mask exposure and exposure of the code. Schemes to avoid this and to maximize through-put include having a beam splitter/combiner to place the code-writer window in an arbitrary position within the image of the mask on the wafer. The codes can also be exposed in a full write-on-the-fly mode without stopping the stage at each lens field. This is a very efficient mode of operation since it is most often sufficient with one stage stroke for each row of dies on the wafer, and a stage stroke is done in 1–10 seconds. However, it requires that the stage is adapted for running in a write-on-the-fly mode, which is very different from the normal stepping mode.

The control system architecture is slightly different between the two cases of simultaneous mask and code exposure on one side, and separate code and exposure (in a single machine or separate machines) on the other. In the simultaneous mode the main exposure is the overriding action and the stepper exposes the fields according to a plan that gives efficient use of the time. For each of the exposure fields the control systems issues a call to the code-writing control unit, which can be implemented as a separate hardware unit or as a separate software module running on the same hardware. The code-writing unit checks its input to see if there should be a code written or not. If so, it collects any external data that is needed for the creation of the code, e.g. real-time clock, chip number, wafer lot and wafer number etc. and uses the instructions how to build the code to assemble the code. These instructions are preferably implemented as code segments in a computer language for maximum flexibility, in a preferred embodiment ANSI C or Java. They contain placement, type of the code and detailed instructions how to build it. A number of predefined types exist, e.g. chip identification string in visually and electronically readable form, random numbers, data from a database, etc. After the code has been created it is sent to the code rasterizer to be converted to a bitmap (or other hardware format) to be loaded into the hardware. The code-writer control unit also generates position information and initiates the laser and SLM circuitry, so that the SLM is loaded before the right stage position is reached and the laser is triggered when the stage reaches the right position. For repeated codes within a stepper field the sequence is repeated several times, and in the case of more than one SLM the same sequence is performed for each SLM. Larger coded areas than the size of the SLM can be accommodated with a buffer from which new data can be loaded after each exposure flash and retriggering of the laser, so that several SLM fields are stitched together.

Design Blocks

When the code is not merely a visible mark, but an electronically readable code, and optionally one combined with some processing power, it is suitably implemented as a design block. One layer is modified by the code exposure, most obviously a metal layer, but due to the perfect process integration with the main exposure of the stepper any layer can be modified with the same ease. For a secret tamper-proof coding a layer deep in the stack can be used, preferably one under CMP to make it invisible in a microscope, e.g. an implantation layer can effectively turn on and off transistors without much trace on the surface of the chip. For device modification it could be interesting to code several layers, possibly all layers of a small segment of the ship. The word code is used here as opposite of the main exposure from the reticle, but the word coding should not be taken literally. It is intended to mean any pattern that is not in the reticle and is allowed to vary between the chips.

An example of a design block is a serial number block. It has a coding area and a readout area, FIG. 4. Inputs to the block is a data CLOCK and READ signal. When the READ is set low the coding is read into the readout circuitry, and when READ goes high it is serially shifted out through the output pad. This little block can be placed on a almost any chip and at the cost of one pad it gives its electronic serial number in serial form every time it is powered up. For a microprocessor or processor core a similar block could load the serial number into a register after a specific instruction. This can be used to many ends: having a unique traceable indentification would be useful for quality assurance as well as for prevention of theft. Software licences could be tied to the processor number, which changes less often than hard-disks and Ethernet cards witch are sometimes used now as computer identification. A unique serial number could be used for self-configuring networks and as a basis for pre-serving the identity of a single computer moving between several networks.

Chip-unique coding can be used in many security contexts. A crypto-processor based on public keys could have its private key hidden inside the chip and the public key published to the external world upon request. With the processing being done inside the same processor and the generation of keys done at write-time during exposure a high degree of security would result.

The design block contains the mask layers for the other layers, the constant part of the variable layer and coupled to it a specification of the code. A specification language is used which specifies the codes type, layer, size and position and optionally a code segment instructing the code-writer control system on how to build he code. The combination of design layout, code specification and software segments can be distributed as a reusable design element, a so-called IP block. Compared to current IP blocks it is more general in the sense that it contains a data program for generation of the code, e.g. in Java. The code-writer and stepper control systems accepts this format and the electronic design system must be able to link the layout and the specification and send them along in such a way that the link can be re-established in the stepper. This will require some new infrastructure in terms of storage and communication of the instruction and data parts from the design office to the wafer fab.

A First Preferred Embodiment

In a first preferred embodiment, FIG. 1a, a code-writer is built into a scanning stepper using 6" reticles 101, a 4× reduction lens 102 creating an image field of 22×34 mm on the wafer 103 on the scanning stage 104. The main exposure wavelength from the laser 105 and illuminator 106 is 248 nanometers and the numerical aperture 0.6 giving a resolution of 0.2 microns. The built-in code-writer has an acoustooptic deflector 107 made of crystalline quartz and a continuous frequency-doubled Arion laser 108 of 257 nm. The collimator 109 on the scanner is chosen so that the resolution along the scan is approximately 700 points and the scan length 1.2 mm at the window 110 in the intermediate focal plane optically corresponding to the reticle plane. The projected area of the scan on the wafer 103 is four times smaller, i.e. the scan is 0.3 mm and the spot 0.4. The scan lines are spaced 0.25 mm, and the scanner writes 50000 scans per second. For a single laser beam this gives a stage speed of 12.5 mm per second, but since the normal scanning speed when exposing from the reticle is 150 mm/second twelve parallel beams are needed to fill the area. The control system is explained elsewhere.

A Second Preferred Embodiment

FIG. 1b shows a second preferred embodiment based on a spatial light modulator, SLM 111. T code-writer is built into a 4× scanning stepper with a reticle field of 22×34 mm. The main exposure wavelength is 248 nanometers and the numerical aperture 0.6 giving a resolution of 0.2 microns. The built-in code-writer has a reflective micromirror SLM with 24 micron mirrors and an array size of 2048×512. The reduction ratio including the main projection lens is 100× and the NA is set to 0.32 giving a diffraction-limited resolution of 0.4 microns. The projected size of the SLM is 0.4×0.1 mm. Many different types of pattern generator principles and different types of SLMs can be used and the diffractive reflective analog SLM described in PCT Application No. WO 99/45439 is used in the preferred embodiment. An advantage with the analog SLM is that the response of the pixels can be calibrated, another that features can be sized and placed in an address grid much finer than the projected size of the SLM pixels. The SLM is illuminated by a pulsed light source 112, in the preferred embodiment another KrF laser with 248 nm wavelength and 25 ns pulse length. The laser light is scrambled and conditioned in the illuminator 113. A semitransparent mirror 115 sends the light to the SLM and allows part of it to pass through after reflection at the SLM and reach the wafer. The telescope 116 and 117 makes an image of the SLM at the code-writer window 110 and the aperture 118 filters out the diffracted part of the reflected light, thereby creating the image and does at the same define the resolution of the code-writer at the wafer.

Past Position Servo

In the embodiment of FIG. 1a it is possible to move the code-writer image relative to the wafer electronically by modifying the drive signals to the scanner and modulator. The SLM in 1b does not have the same options, since the SLM, lens and image have a fixed geometrical relation to each other. But in a pattern generator using an analog SLM it is possible to use an electronic image displacement scheme as a fast-acting servo to correct for stage errors and other position errors. The bitmap to be fed to the SLM is convolved with a 3×3 (or larger) convolution kernel. Such convolutions are well-known in image processing and digital signal processors have efficient instructions for convolution of a bitmap with a small kernel. The basic kernel is

| 0 | 0 | 0 |
|---|---|---|
| 0 | 1 | 0 |
| 0 | 0 | 0 | which does not do anything to the pattern, but leaves the it untouched. When there is a placement error in the pattern generator to be corrected the kernal is replaced by another one with the coefficients shifted, e.g.

| 0 | 0.04 | 0    |
|---|------|------|
| 0 | 0.83 | 0.13 |
| 0 | 0    | 0    |

The second kernel moves the pattern by 0.13 pixel spacings to the right and 0.04 upwards. The pattern is at the same time made slightly fuzzier, but with a suitable optical design this added fuzziness is insignificant compared to the fuzziness caused by the optical diffraction limitation of the projection lens. Larger movements than 1 pixel are done by the addressing in the bitmap or with a larger kernel. The maximum pulse repletion (or image repetition) rate in the preferred embodiment is 1000 Hz and the entire SLM contents needs to be loaded within 0.9 milliseconds. The convolution is done in field programmable logic while the data is being loaded into the SLM. The latency time for the correction is therefore 0.9 milliseconds. This compares favorably to the frequency response of mechanical servos.

Alignment to the Reticle Image

The stepper in the preferred embodiments has an alignment system where the wafer is aligned to the lens and the reticle is independently aligned to the same lens. The alignment between the projection optics and the code-writer optics is made by exposing a test pattern with verniers exposed partly from the reticle and partly by the code-writer. In a different embodiment where the reticle and wafer are aligned to each other and not to the lens, the code-writer needs to be aligned to the reticle. One way of doing this is by mechanical movement of the optics within the code-writer, e.g. the SLM itself, in response to a measured displacement between the reticle and the lens assembly.

The Code-to-bitmap Conversion

The code-to-bitmap conversion (or conversion to another format suitable for the hardware) is done in a conversion unit 130 which is a simpler version of the data-path described in Swedish patent application No. 9903243-5 or in PCT application WO 98/38597 by the same applicant, and with much less parallel operation. since typically only small areas need to be patterned by the code-writer the data is converted and stored in a buffer, while in a full-blown pattern generator all data needs to be converted on the fly since the size of the necessary buffers is impractical.

Conclusion

To summarise, the invention device a system and a method for making small modifications to the pattern in standard processed semiconductor devices. The modifications are made to create a small variable part of the pattern against a large constant part of the same pattern. In a preferred embodiment the exposure of the variable and constant parts are done with the same wavelength in the same combined stepper and code-writer. The invention provides a way of writing variable parts of the chip automatic, inexpensive and risk-free. A system for automatic design and production of die-unique patterns is also provided.

The invention has been described by means of examples. The preferred embodiments described use both spatial light modulators and laser-scanning patterning. It will be obvious for a person skilled in the art to make modifications to the examples described, using other components and combinations. However, as long as the function can be described as combining a constant pattern and a variable pattern in the same layer using two optical exposure systems, one exposing from a mask, the other from a computer file, such obvious changes to the embodiments are to be seen as other embodiments of the same invention. Optical exposure is intended to have a broad meaning, including all exposure of electromagnetic radiation that is controlled by optical components such as mirrors, prisms, gratings, lenses, shutters and SLMs. In practice the range of optics extends from far infrared (IR) to extreme ultra-violet (EUV) and soft x-ray.

What is claimed is:

1. An apparatus for writing chip-unique information on microelectronic or microoptic devices characterized by
    a first exposure system using the projection of a reticle for exposing at least one layer of said device,
    a second exposure system using the projection of a spatial light modulator for exposing the same at least one layer of said device.

2. The apparatus according to claim 1, wherein the second exposure system comprises an analog spatial light modulator.

3. The apparatus according to claim 1, wherein the first and second exposure system are using the same wavelength.

4. The apparatus according to claim 1, wherein the first and second exposure system are using different wavelengths.

5. The apparatus according to claim 1, wherein it further comprises a control system for controlling at least the second exposure system for writing the chip-unique information on the microelectronic or microoptic devices.

6. The apparatus according to claim 5, wherein the control system comprises
    a control system for the first exposure system initiating the exposure of the exposure field containing the device,
    a codewriter control system compiling information about the programming for said particular device,
    and a code rasterizing unit for creating a hardware format to be fed to the spatial light modulator (SLM) for said particular device.

7. The apparatus according to claim 1, wherein said first and second exposure systems are operable for at least partly simultaneous exposure of said device.

* * * * *